US007750059B2

(12) United States Patent
Jung et al.

(10) Patent No.: US 7,750,059 B2
(45) Date of Patent: Jul. 6, 2010

(54) POLYMER SOLUTION FOR NANOIMPRINT LITHOGRAPHY TO REDUCE IMPRINT TEMPERATURE AND PRESSURE

(75) Inventors: Gun Young Jung, Gwangju Si (KR); Sivapackia Ganapathiappan, Los Altos, CA (US); Yong Chen, Sherman Oaks, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 684 days.

(21) Appl. No.: 10/313,596

(22) Filed: Dec. 4, 2002

(65) Prior Publication Data

US 2004/0110856 A1 Jun. 10, 2004

(51) Int. Cl.
*B29C 35/08* (2006.01)

(52) U.S. Cl. .......................... 522/6; 264/496; 264/293; 264/482; 216/24; 216/52; 216/57

(58) Field of Classification Search .................... 522/6, 522/33; 264/494, 293, 1.24, 1.27, 1.34, 1.38, 264/496, 482; 525/244, 260, 263; 216/83, 216/24, 52, 57

See application file for complete search history.

(56) References Cited

U.S. PATENT DOCUMENTS

| | | | | |
|---|---|---|---|---|
| 5,902,599 | A * | 5/1999 | Anseth et al. | 424/426 |
| 6,203,911 | B1 * | 3/2001 | Weberg et al. | 428/413 |
| 6,294,450 | B1 | 9/2001 | Chen et al. | |
| 6,407,443 | B2 | 6/2002 | Chen et al. | |
| 6,432,740 | B1 | 8/2002 | Chen et al. | |
| 6,558,607 | B1 * | 5/2003 | Winter et al. | 264/425 |
| 6,582,971 | B1 * | 6/2003 | Singh et al. | 436/518 |
| 2004/0043254 | A1 * | 3/2004 | Wisnudel et al. | 428/694 ML |

FOREIGN PATENT DOCUMENTS

| | | |
|---|---|---|
| EP | 0 428 133 | * 11/1990 |
| EP | 0405568 | 1/1991 |
| WO | WO02/07199 | 1/2002 |

OTHER PUBLICATIONS

Chou et al., Science vol. 272 (Apr. 5, 1996).*

Khang, et al., "Room-temperature Imprint Lithography by Solvent Vapor Treatment," Applied Physics Letters, vol. 76, No. 7, Feb. 14, 2000, pp. 870-872.

Matsui, et al., "Room Temperature Replication in Spin on Glass by Nanoimprint Technology," Journal of Vacuum Science Technology B, vol. 19, No. 6, Nov./Dec. 2001, pp. 2801-2805.

Chou, et al., "Imprint Lithography with 25-Nanometer Resolution," Science, vol. 272, Apr. 5, 1996, pp. 85-87.

Patent Abstracts of Japan—"Manufacture of Resin Mold for Injection Molding Product Excellent in Luster"—Jul. 22, 1985—1 page.

Lebib, A et al—"Room-Temperature and Low-Pressure Nanoimprint Lithography"—Jul. 2002—pp. 61-62.

* cited by examiner

*Primary Examiner*—Robert D. Harlan
(74) *Attorney, Agent, or Firm*—David W. Collins

(57) ABSTRACT

A method of forming features on substrates by imprinting is provided. The method comprises: (a) forming a polymer solution comprising at least one polymer dissolved in at least one polymerizable monomer; and (b) depositing the polymer solution on a substrate to form a liquid film thereon; and then either: (c) curing the liquid film by causing the monomer(s) to polymerize and optionally cross-linking the polymer(s) to thereby form a polymer film, the polymer film having a glass transition temperature ($T_g$); and imprinting the polymer film with a mold having a desired pattern to form a corresponding negative pattern in the polymer film, or (d) imprinting the liquid film with the mold and curing it to form the polymer film. The temperature of imprinting is as little as 10° C. above the $T_g$, or even less if the film is in the liquid state. The pressure of the imprinting can be within the range of 100 to 500 psi.

22 Claims, 2 Drawing Sheets

POLYMER SOLUTION FOR NANOIMPRINT LITHOGRAPHY TO REDUCE IMPRINT TEMPERATURE AND PRESSURE

TECHNICAL FIELD

The present invention is generally directed to the inexpensive manufacturing of systems that have critical dimensions less than 100 nm, such as nano-electronic circuits, nano-electro-mechanical systems (NEMS), optical systems (such as gratings, photonic crystals, and other types of optical couplers and devices), and highly sensitive sensors and detectors based on nanometer scale components. However, the present invention can also be used to fabricate anything that is currently fabricated using optical or electron beam lithography techniques.

BACKGROUND ART

Nano-imprint lithography was initiated as an alternative to conventional lithography techniques to achieve nanoscale structures with high throughput and low cost. The nanoscale structures are transferred from a mold to a polymer film covering a substrate during the imprinting process; see, e.g., U.S. Pat. No. 6,294,450, entitled "Nanoscale Patterning for the Formation of Extensive Wires", issued to Yong Chen et al on Sep. 25, 2001; U.S. Pat. No. 6,407,443, entitled "Nanoscale Patterning for the Formation of Extensive Wires", issued to Yong Chen et al on Jun. 18, 2002; and U.S. Pat. No. 6,432,740, entitled "Fabrication of Molecular Electronic Circuit by Imprinting", issued to Yong Chen on Aug. 13, 2002, all assigned to the same assignee as the present application, the contents of which are totally incorporated herein by reference.

To deform the shape of the polymer, the substrate and polymer film are heated to above the glass transition temperature ($T_g$) of the polymer and the mold is pressed into the film, resulting in a reverse replica of the mold on the substrate. Poly(methyl methacrylate) (PMMA) has been a popular thermoplastic polymer despite the requirements for high operating temperature (~200° C.) and pressure (~2,000 psig).

For the PMMA process, a polymer solution (polymer dissolved in solvent) is spin-coated onto the substrate and then the polymer film is baked to remove any residual solvent inside the film. This baking procedure results in a hard polymer film, which in turn requires a high imprinting temperature, typically at least 50° C. above the $T_g$, and high pressure to ensure viscous flow of the polymer into the grooves and crevices of the mold before it freezes. The high pressure is detrimental to the nanoscale features on the stamp and both the high temperature and the high pressure can damage the functional materials of the circuits being fabricated, such as molecules or nanoscale semiconductor components, exposed to this process. The unwanted residual solvent in the polymer film results in film shrinkage and possible cracking associated with the solvent evaporation during the heating process, which can cause serious problems in pattern accuracy.

Recently, room-temperature imprinting lithography was suggested by vapor treatment of the dried polymer film (case 1) and by using new material, spin-on-glass (SOG; case 2). However, these processes suffer from the poor adhesion between polymer and substrate after solvent treatment (case 1) and fast drying of the spun film which also has a poor adhesion to metal due to its solvent nature (case 2).

There remains a need for an imprinting process that operates at a lower temperature and lower pressure than the prior art, as well as avoiding most, if not all, of the problems of the prior art.

DISCLOSURE OF INVENTION

In accordance with the embodiments disclosed herein, an improved method of forming features on substrates by imprinting is provided. However, the teachings herein can also be used to make anything that is currently fabricated using optical or electron beam lithography techniques. The improved method comprises:

(a) forming a polymer solution comprising at least one polymer dissolved in at least one polymerizable monomer; and (b) depositing the polymer solution on the substrate to form a liquid film thereon; and then in either order (c) curing the liquid film by causing the monomer(s) to polymerize and optionally cross-linking the polymer(s) to thereby form a polymer film, the polymer film having a glass transition temperature of less than 100° C.; and (d) imprinting the polymer film with a mold having a desired pattern to form a corresponding negative pattern in said polymer film.

The approach presented herein focuses on reducing both the imprinting temperature and pressure by utilizing a polymer dissolved in a polymerizable monomer solution. The film deposited from this polymer/monomer solution (polymer solution) does not contain any volatile solvents, which eliminates the baking step to remove the residual solvents from the film. The elimination of baking results in a liquid film that can flow into nanoscale openings of the mold and deform easily with low temperature and low pressure in nanoimprint lithography. Alternately, the film can be cured before imprint by choosing an appropriate polymer or polymers that have a low glass transition temperature and good adhesion to different substrate materials.

BEST MODES FOR CARRYING OUT THE INVENTION

Reference is made now in detail to specific embodiments, which illustrates the best mode presently contemplated by the inventors for practicing the invention. Alternative embodiments are also briefly described as applicable.

The present teachings utilize a polymer solution of at least one appropriate polymer dissolved in a polymerizable monomer or monomer mixture. The polymer solution optionally contains one or more initiators, one or more cross-linkers and/or one or more viscosity modifiers. The monomer may be the same or different from the polymer units. If the monomer is the same, then the final polymer film will be relatively pure polymer that is uniform in composition. If the monomer is different from the polymer units, the resulting film may be a polymer blend (i.e., a physical mixture of two different polymers), an interpenetrating network of two polymers, a copolymer (chemical bonding between the two different types of monomer units), or a block co-polymer (regions of polymer chains with one type of monomer unit). Each of these types of polymeric film may have advantages over the others, depending on the specific applications. The polymer solution is then deposited on a substrate to form a liquid film thereon. As used herein the term "solution" is employed in its customary usage, namely, a homogeneous mixture of two or more substances. This is to be distinguished from the term "emulsion", which is a fluid consisting of a heterogeneous mixture of two phases, both of which are liquid at ordinary temperatures. The former, being homogeneous, comprises a single phase, while the latter, being heterogeneous, comprises two phases.

Figure 1A:
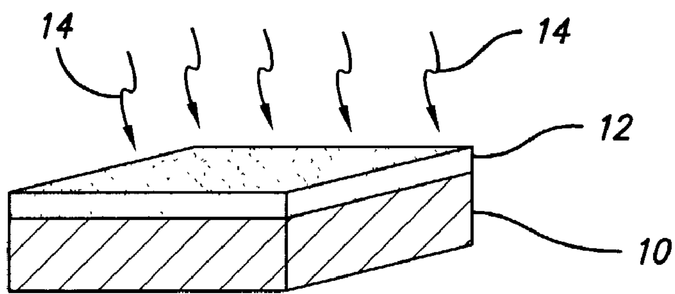
FIGS. 1a-1d depict a process sequence of a first embodiment for forming nanoscale wires by nanoimprint lithography.
Figure 1B:
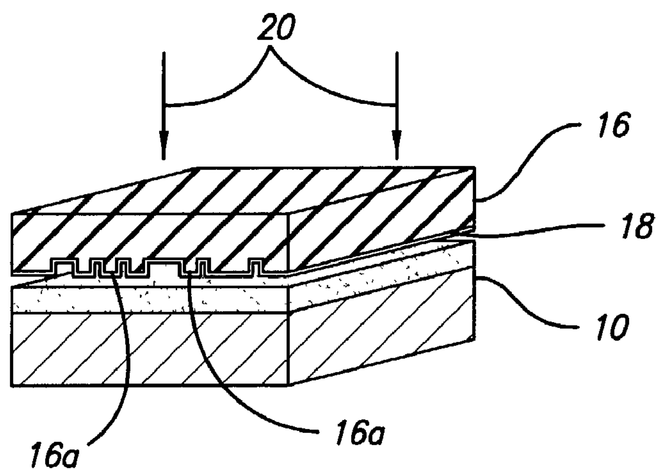
Figure 1C:
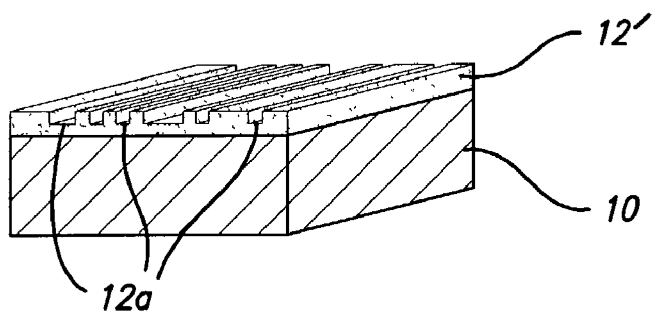
Figure 1D:
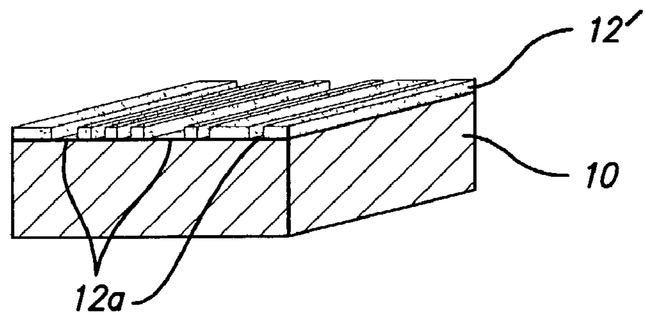
Figure 2A:
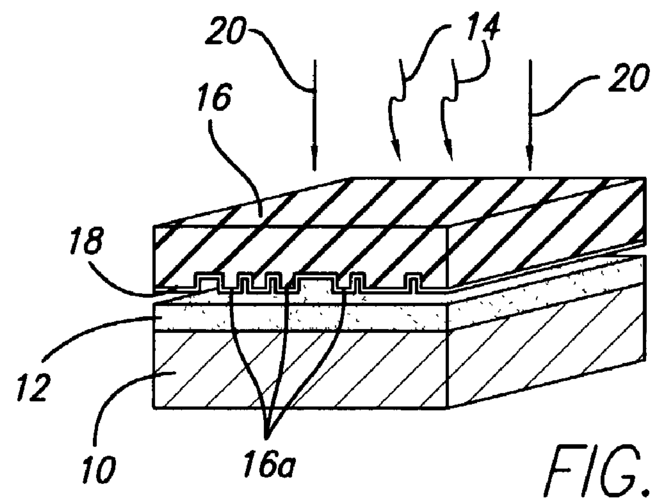
FIGS. 2a-2c depict a process sequence of a second embodiment for forming nanoscale wires by nanoimprint lithography.
Figure 2B:
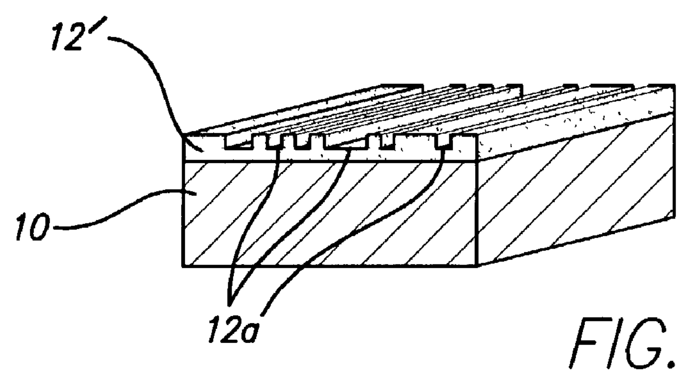
Figure 2C:
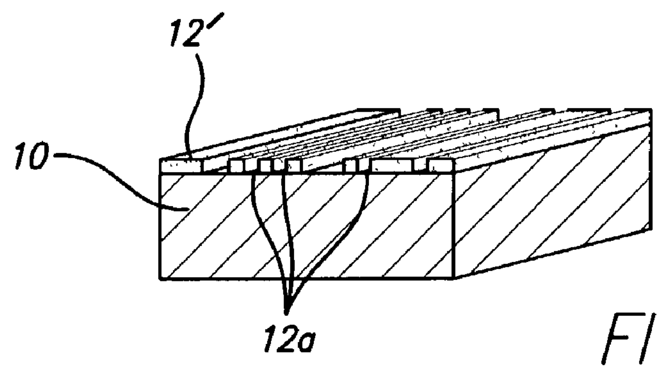

There are two general paths to the utilization of these liquid films. The first is to deposit the polymer solution on the substrate, such as by spinning or casting, to form a liquid film, and then to cure the liquid film to form a polymer film by exposing the liquid film to heat or ultraviolet radiation, or both, or any other process that will cause the monomers to polymerize and the polymer chains to cross-link, if that is desired. In this case, it is important to make sure that the final polymer film has a low glass transition temperature, $T_g$, in the range of about 0° C. to 100° C. This ensures that when the nano-imprint process is carried out, the temperature and pressure required to obtain a faithful replica of the mold will be relatively low, as compared with the prior art process (FIGS. 1_a_-1_d_). The second is to deposit the polymer solution on a substrate and immediately perform the imprinting process on the liquid film 12. The liquid film 12 is then cured in the presence of the mold by heating or exposure to UV radiation, or both, or other process (FIGS. 2_a_-2_c_). Again, the temperature and pressure are relatively low, as compared with the prior art process. Further details and descriptions of this approach are presented below.

Specifically with regard to the process depicted in FIGS. 1_a_-1_d_, FIG. 1_a_ illustrates a substrate 10, for example, silicon dioxide, on which a liquid film 12 has been deposited, such as by spinning or casting. The liquid film 12 is further polymerized, and possibly cross-linked, to form a polymer film 12', using heating or UV radiation 14 or both. As shown in FIG. 1_b_, a mold 16 provided with a release layer 18 is pressed into the polymer film 12', using pressure shown at 20. The mold 16 has formed therein a pattern comprising a plurality of protrusions 16_a_ that can have critical dimensions less than 100 nm, to be used in building nano-electronic circuits, nano-electro-mechanical systems (NEMS), optical systems (such as grating, photonic crystals, and other types of optical couplers and devices), and highly sensitive sensors and detectors based on nanometer scale components. These protrusions 16_a_, upon imprinting, form a corresponding plurality of indentations 12_a_ in the polymer film 12', as shown in FIG. 1_c_.

The temperature of imprinting is above the glass transition temperature of the polymer film 12' and preferably is as little as 10° C. above the $T_g$. The pressure of the imprinting is within the range of 100 to 500 psi.

Once the pattern has been transferred into the polymer film 12', then the polymer film is etched, such as with a plasma, to expose portions of the underlying substrate 10, as shown in FIG. 1_d_. Following the etching, the patterned polymer-coated substrate can then be further processed, such as by blanket-depositing metal and using the well-known lift-off process to remove metal not in direct physical contact with the substrate 10. Briefly, the polymer film 12' is dissolved in a solvent, taking with it any metal lying on top of the polymer film, and leaving behind metal that had been deposited in the grooves 12_a_ of the polymer. These metal lines, being of nanoscale dimensions, are then used as the electrodes in nanoscale devices.

Alternative procedures are also well known for etching into the polymer film 12', and these are also suitably employed herein. The procedures disclosed herein have broad applications in use beyond nano-technology imprinting applications. Specifically, the procedures disclosed herein can be used in any imprinting process presently employing conventional photolithography or electron beam lithography, at a cost that is less than either of the foregoing conventional procedures.

Preferably, systems are fabricated by the teachings herein that have critical dimensions less than 100 nm, such as nano-electronic circuits, nano-electro-mechanical systems (NEMS), optical systems (such as grating, photonic crystals, and other types of optical couplers and devices), and highly sensitive sensors and detectors based on nanometer scale components With regard to the process depicted in FIGS. 2_a_-2_c_, the liquid film 12 is deposited on the substrate 10, again, by spinning or casting, and the imprinting process is performed immediately on the liquid film to form the pattern in the liquid layer, which is then further polymerized and possibly cross-linked within polymer chains, by applying heat or ultra-violet radiation or both, with the mold in place, as shown at 20, as illustrated in FIG. 2_a_. The pattern transfer is shown in FIG. 2_b_, which is identical to FIG. 1_c_. An etch, such as with plasma, is performed, as shown in FIG. 2_c_, which is identical to FIG. 1_d_. The patterned polymer-coated substrate 10 is then further processed as described above. In this case, the imprinting process is carried out on the liquid film 12 at even lower temperatures than specified above for the solid polymer film 12', possibly as low as room temperature (~23° C.), depending on the material comprising the polymer solution and the initiator, if any.

The optimum glass transition temperature of the cured polymer films 12' is from 0° to 100° C. and preferably from 200 to 70° C. and most preferably from 400 to 60° C. The polymer film 12' can be prepared in a wide variety of ways. The preferred way of making the polymer films 12' is by free-radical polymerization including live free-radicals, for example, TEMPO (2,2,6,6-tetramethyl-1-piperidinyloxy free radical). The polymerization methods also include anionic, cationic, and atom transfer radical polymerizations. Generation of free radicals is achieved by heat, e-beam, irradiation with light, especially UV light, microwave or gamma rays. Other processes can also be carried out by addition, condensation and elimination processes known in the polymer art, The structures of the desired polymers used in the polymer solution that have a low glass transition temperature are classified as four types and are shown below. These polymers have a $T_g$ in the same range as given above for the polymer film 12'.

Type A:

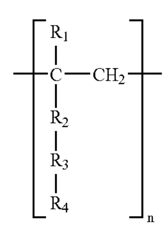

where:

$R_1$=H, $CH_3$, Cl, F, aryl group;

$R_2$=bond, C(O), O, C(O)O, OC(O);

$R_3$=$CH_2$, $CH_2CH_2$ or branched or linear alkyl chain with 2 to 10 carbons;

$R_4$=H, $CH_3$, F, Cl, Br, branched or linear alkyl chain with 2 to 20 carbons, aryl or substituted aryl, $OR_5$, $C(O)OR_5$ and $C(O)R_5$;

$R_5$=H, $CH_3$, branched or linear alkyl chain of 2 to 20 carbons with or without substitution, aryl or substituted aryl groups.

Type B

Type B comprise the same monomer structure as that of Type A, but using polymerization of more than one monomer species to form co-polymers, block co-polymers or polymer blends.

Type C:

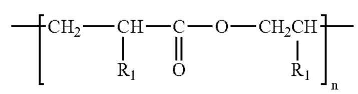

where:

$R_1$=H, $CH_3$, alkyl or aryl group with and without substitution.

Type D:

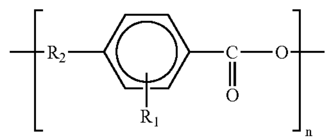

where:

$R_1$=H, Cl, Br, Fl, alkyl or aryl and substituted alkyl or aryl with 1 to 20 carbon atoms; and $R_2$=alkylene or substituted alkylene with 1 to 20 carbon atoms.

The weight average molecular weight of the foregoing polymers ranges from 5,000 to 3,000,000. The preferred range is from 20,000 to 500,000, more preferably from 50,000 to 200,000. The polymers employed herein have a polydispersity from 1 to 20 and preferably from 1 to 5 and most preferably from 1 to 2.

The monomer(s) employed in dissolving the polymer(s) in the polymer solution have polymerizable unsaturated groups, such as acrylates and methacrylates, of alcohols and unsaturated alcohols. Examples of monomers that can be used to dissolve the polymer or polymer mixtures include, but are not limited to, the following: methyl methacrylate, butyl methacrylate, hexyl methacrylate, hexyl acrylate, ethylhexyl methacrylate, ethylhexyl acrylate, octyl acrylate, octyl methacrylate, benzyl methacrylate, benzyl acrylate, trifluoroethyl acrylate, trifluoroethyl methacrylate, hydroxyethyl acrylate, hydroxyethyl methacrylate, styrene, $\alpha$-methylstyrene, vinyltoluene, chloromethyl styrene, butadiene, vinyl pyrrolidone, vinyl imidazole, allyl alcohol, vinyl acetate, acrylonitrile, glycidyl methacrylate, ethyl acrylate, ethyl methacrylate, and mixtures thereof.

The resulting polymer films 12' made from combinations of the polymer(s) and monomer(s) described above are usually blends or interpenetrating networks.

Another embodiment of the present disclosure is that polymers having polymerizable end-groups can be substituted for the general structure polymers mentioned above and optionally in combination with or without crosslinkers in the system. Examples include polystyrene with methacrylate terminated, poly(tetrahydrofuran) divinyl ether, poly(ethylene glycol) diacrylate or dimethacrylate, poly(propylene glycol) diacrylate or dimethacrylate, poly(dimethyl siloxane) with divinyl terminated, polybutadiene dimethacrylate. Other end groups such as epoxy- or carboxy-containing polymers may alternatively be used.

The polymers with aromatic pendant groups on methacrylates, such as poly (benzyl methacrylate) (Type A, Formula (I) below) have glass transition temperatures ($T_g \approx 54°$ C.) that are much lower than that of their counterparts without phenyl rings, e.g. PMMA ($T_g \approx 110°$ C.) (Type A, Formula (II) below).

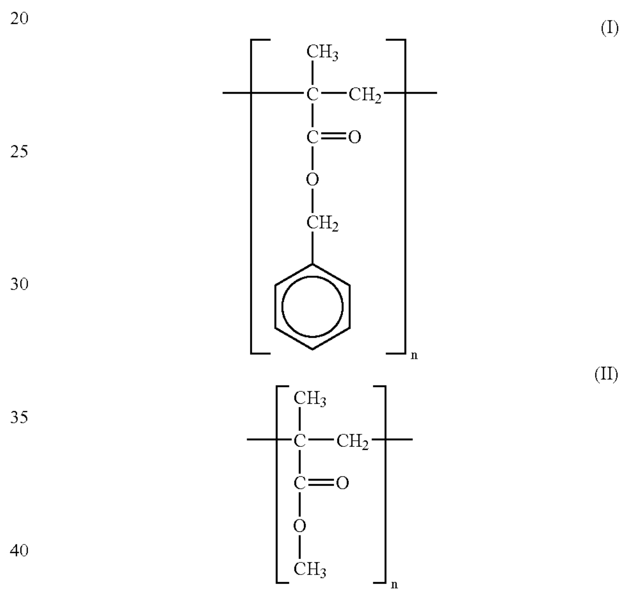

For use as imprint films, including nano-imprint films, according to the present teachings, such aromatic-containing polymers are dissolved into their monomers rather than dissolving them into any other solvent. This polymer solution also contains one or more initiators to polymerize the monomer or mixture of monomers during a thermal- or photo-activating process. The polymer solution is deposited onto the substrate, such as by spin-coating, and utilized directly for nano-imprinting without baking. In this case, the film 12 is liquid and can fill the fine openings of the mold easily at a low temperature around the glass transition temperature and with a low hydraulic pressure. For example, a nanoscale pattern was transferred to a poly(benzyl methacrylate) film at a temperature of 70° C. and a pressure as low as 200 psig. For the thermoplastic polymer films, a hydraulic pressure can be applied to the film either from the room temperature or near the glass transition temperature during the heating process.

The initiators that are optionally combined with the polymer(s) and monomer(s) to form the polymer solution are compounds that generate free radicals to initiate the polymerization for unsaturated compounds. The following initiators are used for thermal curing. Examples include hydrogen peroxide, benzoyl peroxide, azo compounds, such as 2,2'-azobisiso-butyronitrile, 4,4'azobis(cyclohexanecarbonitrile), 4,4'- azobis(4-cyano-valeric acid) and 2,2'-azobis(2-methylpropane). Other commercial products such as Trigonox 21 and Perkadox 16, both organic peroxides, can also be used as an initiator. Trigonox 21 is chemically known as t-butyl peroxy-2ethylhexanoate, while Perkadox 16 is chemically known as di(t-butylcyclohexyl)peroxydicarbonate. Both Trigonox and Perkadox are available from Akzo & Nobel. Other examples of organic peroxides suitably employed herein include, but are not limited to, dicumyl peroxide, dioctanoyl peroxide, dimyristyl peroxide, dilauroyl peroxide, 1,1-di(t-butylperoxycyclohexane), t-butyl peroxydiethylacetate, cumyl hydroperoxide, and the like.

Photoinitiators are used for UV curing, and include, but are not limited to, any of the commonly-known photoinitiators, including α-hydroxy-ketones, (α-amino-ketones, and benzophenones. Included within the generic class of α-hydroxy-ketones are acetophenones. An example of a photoinitiator suitably employed is α,α-dimethyl-α-hydroxy acetophenone (2-hydroxy-2-methyl-1-phenyl-propan-1-one), which is available from Ciba Co. under the trade mark Darocur® 1173.

One or more cross-linkers may optionally be added to the polymer solution to increase the strength of the film and to keep the integrity of the polymer film 12' during etching or other processes. The cross-linkers that can be used in these cases are derived from moieties having difunctional or polyfunctional polymerizable groups. Examples include, but are not limited to, ethylene glycol dimethacrylate, 1,4-butanediol dimethacrylate, triethylene glycol dimethacrylate, tetraethyleneglycol dimethacrylate, 1,6-hexanediol dimethacrylate, neopentyl glycol dimethacrylate, polyethylene glycol (PEG) dimethacrylate wherein the polyethylene glycol has a molecular weight from 400 to 6000, tetraethylene glycol dimethacrylate, ethoxylated Bisphenol A dimethacrylate with up to 50 ethoxy units, cyclohexane dimethanol dimethacrylate, tripropylene glycol dimethacrylate, trimethylolpropane trimethacrylate, pentaerythritol trimethacrylate, pentaerythritol tetramethacrylate, dipentaerythritol pentamethacrylate, alkoxylated glyceryl with up to 30 carbon atoms, trimethylolpropane triacrylate, tris(2-hydroxyethyl) isocyanurate trimethacrylate, 3-(acryloyloxy)-2-hydroxypropyl methacrylate, mono-2-(methacryloyloxyethyl) maleate, divinyl benzene, methacrylic anhydride, pentaerythritol triallyl ether, di(ethylene glycol) dimethacrylate, di(ethylene glycol) divinyl ether, tetraethylene glycol divinyl ether, di(ethylene glycol) diacrylate, 3-(acryloyloxy)-2-hydroxypropyl methacrylate and mono-2-(methacryloyloxy)ethyl maleate, wherein any methacrylate group can be replaced with an acrylate group or an acrylamide group or a methacrylamide group. Further, the above monomers may also be substituted with other groups, such as halogen, alkyl, or aryl groups. Optionally, macro monomers (high molecular weight monomers) with polymerizable end-groups containing polymers can also be included as an extra additive or to replace the above difunctional moieties. Examples of such end groups include, but are not limited to, acrylate, methacrylate, epoxy, and carboxy groups.

The percentage of polymer in the polymer solution is important to assure a high-quality pattern transfer over the entire area of the film-covered substrate. If the percentage of polymer is too high, then the viscosity of the solution is too high to flow to the edge of the mold during the imprint process. This produces a non-uniform film thickness after imprinting, even if the solution fills the mold openings. The thicker regions of the film can be completely removed from the substrate during the lift-off process, taking with it all of the material that was deposited to form some type of structure. If the percentage of polymer is too low, then the spun film beads up on the surface or forms other non-uniformities because of surface tension and/or the inability to wet the surface on which the film was deposited. This requires that the imprinting procedure should be performed as soon as possible after coating to avoid beading of the film. There is thus a trade-off between the viscosity of the solution and the amount of time the deposited film can sit on a sample before the film becomes non-uniform. In this connection, the concentration of the polymer in the polymer solution is in the range of 0.1 to 50 wt %, preferably 1 to 20 wt %, and most preferably 5 to 10 wt %.

The optimum condition for a particular polymer and processing environment must be determined from a series of control experiments utilizing solutions with different polymer percentages. Besides adjusting the relative amounts of polymer and monomer, it is also possible to use small amounts of a viscosity modifier to obtain the appropriate fluid properties and drying times. Examples of viscosity modifiers include, but are not limited to, polyethyl oxazoline, polynorbornene, poly alpha-pinenes and poly beta-pinenes, poly(styrene-co-methylstyrene), poly(tetrahydrofuran), poly(vinyl alcohol-co-ethylene), poly(vinyl chloride-co-isobutyl vinyl ether), poly(vinyl chloride-co-vinyl acetate), poly(vinyl phenyl ketone), poly(vinyl phenol-co-methyl methacrylate), hydroxy ethyl cellulose, grafted polymeric polysaccharide, and styrene-diene polymers.

A spin-coated liquid film made from a solution of one or more polymers dissolved in one or more polymerizable monomers has several advantages over that based on the prior art process, which involves dissolving a polymer in a volatile solvent and baking:

(1) Low imprint temperature, preferably as little as 10° C. above the $T_g$, compared with the prior art imprint temperature on the order of 50° C. above the $T_g$, or even lower in the case of a liquid film.

(2) Low imprint pressure (100 to 500 psi) because of the use of the liquid film, compared with the prior art imprint pressure on the order of 2,000 psi.

(3) Elimination of the baking step, along with any cracking or distortions of the film.

(4) No defects from evaporation of the residual solvents after imprinting on the polymer film.

(5) Minimize wear of the mold by using low imprint pressure.

(6) Easy to replicate the nanoscale features of the mold and eliminate excess material because of the liquid film.

(7) Enhance the resolution of the imprint, since generally mild conditions are used without large changes in temperature or pressure.

(8) Decrease the stress on and damage to functional materials making up the circuits, such as molecules or semiconductor nanodevices, exposed to the imprint process.

INDUSTRIAL APPLICABILITY

The use of the polymer solution prepared by dissolving polymer in liquid monomer is expected to find use in imprint lithography for inexpensively manufacturing systems, particularly nano-imprinting with critical features smaller than 100 nm.

What is claimed is:

1. An imprintable polymer solution for imprinting, said polymer solution comprising:

at least one polymer dissolved in at least one polymerizable monomer;

at least one component selected from the group consisting of at least one cross-linker and at least one viscosity modifier; and at least one photoinitiator selected from the group consisting of α-hydroxy-ketones, α-amino-ketones, and benzophenones;

wherein said at least one cross-linker is selected from molecules that have difunctional polymerizable groups, and wherein said at least one cross-linker is selected from the group consisting of ethylene glycol dimethacrylate, 1,4-butanediol dimethacrylate, triethylene glycol dimethacrylate, tetraethyleneglycol dimethacrylate, 1,6-hexanediol dimethacrylate, neopentyl glycol dimethacrylate, polyethylene glycol (PEG) dimethacrylate wherein the polyethylene glycol has a molecular weight from 400 to 6000, tetraethylene glycol dimethacrylate, ethoxylated Bisphenol A dimethacrylate with up to 50 ethoxy units, cyclohexane dimethanol dimethacrylate, tripropylene glycol dimethacrylate, trimethylolpropane trimethacrylate, pentaerythritol trimethacrylate, pentaerythritol tetramethacrylate, dipentaerythritol pentamethacrylate, alkoxylated glyceryl with up to 30 carbon atoms, trimethylolpropane trimethacrylate, tris(2-hydroxyethyl) isocyanurate trimethacrylate, 3-(acryloyloxy)-2-hydroxypropyl methacrylate, mono-2-(methacryloyloxyethyl) maleate, divinyl benzene, methacrylic anhydride, pentaerythritol triallyl ether, di(ethylene glycol) dimethacrylate, di(ethylene glycol) divinyl ether, tetraethylene glycol divinyl ether, di(ethylene glycol) diacrylate, 3-(acryloyloxy)-2-hydroxypropyl methacrylate and mono-2-(methacryloyloxy)ethyl maleate, wherein any methacrylate group can be replaced with an acrylate group or an acrylamide group or a methacrylamide group and wherein the foregoing compounds are either unsubstituted or substituted with at least one group selected from the group consisting of halogen, alkyl, or aryl groups.

2. The polymer solution of claim 1 wherein said at least one polymer has a concentration in said polymer solution of about 0.1 to 50 wt%.

3. The polymer solution of claim 2 wherein said concentration is about 1 to 20 wt %.

4. The polymer solution of claim 3 wherein said concentration is about 5 to 10 wt %.

5. The polymer solution of claim 1 wherein said polymer solution comprises one monomer and one polymer.

6. The polymer solution of claim 5 wherein said monomer is the same as monomer units comprising said polymer.

7. The polymer solution of claim 5 wherein said monomer is different from monomer units comprising said polymer.

8. The polymer solution of claim 1 wherein said at least one polymer is dissolved into any monomer or monomer mixture that said at least one polymer is soluble in.

9. An imprintable polymer solution for imprinting, said polymer solution comprising:

at least one polymer dissolved in at least one polymerizable monomer, wherein said at least one polymer is dissolved into any monomer or monomer mixture that said at least one polymer is soluble in, and wherein said at least one polymer has a structure selected from the group consisting of:

Type A:

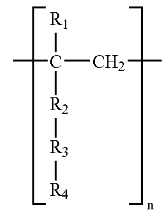

where:

$R_1$=H, $CH_3$, aryl group, $R_2$=bond, C(O), O, C(O)O, OC(O), $R_3$=$CH_2$, $CH_2CH_2$ or branched or linear alkyl chain with 2 to 10 carbons, $R_4$=H, $CH_3$, branched or linear alkyl chain with 2 to 20 carbons, aryl or substituted aryl, $OR_5$, $C(O)OR_5$ and $C(O)R_5$, $R_5$=H, $OH_3$, branched or linear alkyl chain of 2 to 20 carbons with or without substitution, aryl or substituted aryl groups;

Type B has the same structure as that of Type A, but using polymerization of more than one monomer selected from the polymers to obtain Type A polymers;

Type C:

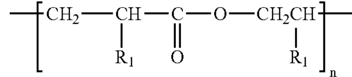

where:

$R_1$=H, $CH_3$, alkyl or aryl group with and without substitution; and

Type D:

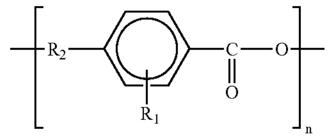

where:

$R_1$=H, alkyl or aryl and substituted alkyl or aryl with 1 to 20 carbon atoms; and $R_2$=alkylene or substituted alkylene with 1 to 20 carbon atoms; and at least one photoinitiator.

10. The polymer solution of claim 9 wherein said at least one polymer has a weight average molecular weight within a range of about 5,000 to 3,000,000.

11. The polymer solution of claim 10 wherein said weight average molecular weight is within a range of about 20,000 to 500,000.

12. The polymer solution of claim 11 wherein said weight average molecular weight is within a range of about 50,000 to 200,000.

13. The polymer solution of claim 9 wherein said at least one polymer has a polydispersity within a range of about 1 to 20.

14. An imprintable polymer solution for imprinting, said polymer solution comprising:

at least one polymer dissolved in at least one polymerizable monomer, wherein said at least one polymer is dissolved into any monomer or monomer mixture that said at least one polymer is soluble in, and wherein said at least one polymer has a structure selected from the group consisting of:

Type A:

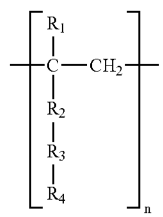

where:

$R_1$=H, $CH_3$, Cl, F, aryl group $R_2$=bond, C(O), O, C(O)O, OC(O), $R_3$=$CH_2$, $CH_2CH_2$ or branched or linear alkyl chain with 2 to 10 carbons, $R_4$=H, $CH_3$, F, Cl, Br, branched or linear alkyl chain with 2 to 20 carbons, aryl or substituted aryl, $OR_5$, $C(O)OR_5$ and $C(O)R_5$, $R_5$=H, $CH_3$, branched or linear alkyl chain of 2 to 20 carbons with or without substitution, aryl or substituted aryl groups;

Type B: has the same structure as that of Type A, but using polymerization of more than one monomer selected from the polymers to obtain Type A polymers;

Type C:

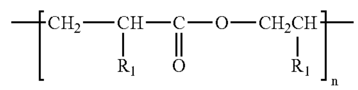

where:

$R_1$=H, $CH_3$, alkyl or aryl group with and without substitution; and

Type D:

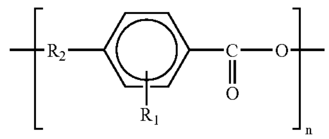

where:

$R_1$=H, Cl, Br, F, alkyl or aryl and substituted alkyl or aryl with 1 to 20 carbon atoms; and $R_2$=alkylene or substituted alkylene with 1 to 20 carbon atoms; and at least one photoinitiator;

wherein said at least one polymer has a polydisperisity within a range of about 1 to 5.

15. The polymer solution of claim 14 wherein said polydispersity is within a range of about 1 to 2.

16. An imprintable polymer solution for imprinting, said polymer solution comprising:

at least one polymer dissolved in at least one polymerizable monomer, wherein said at least one polymer is dissolved into any monomer or monomer mixture that said at least one polymer is soluble in, and wherein said at least one polymer has a structure selected from the group consisting of:

Type A:

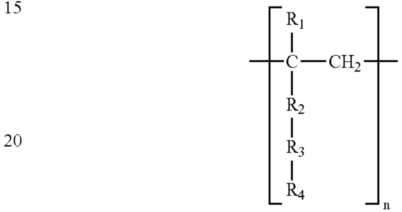

where: $R_1$=H, $CH_3$, Cl, F, aryl group, $R_2$=bond, C(O), O, C(O)O, OC(O), $R_3$=$CH_2$,$CH_2CH_2$ or branched or linear alkyl chain with 2 to 10 carbons, $R_4$=H, $CH_3$, F, Cl, Br, branched or linear alkyl chain with 2 to 20 carbons, aryl or substituted aryl, $OR_5$, $C(O)OR_5$ and $C(O)R_5$, $R_5$=H, $CH_3$, branched or linear alkyl chain of 2 to 20 carbons with or without substitution, aryl or substituted aryl groups;

Type B: has the same structure as that of Type A, but using polymerization of more than one monomer selected from the polymers to obtain Type A polymers;

Type C:

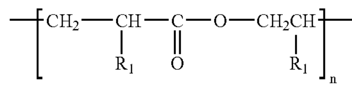

where:

$R_1$=H, $CH_3$, alkyl or aryl group with and without substitution; and

Type D:

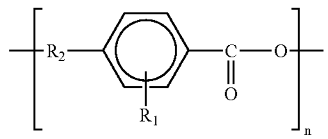

where:

$R_1$=H, Cl, Br, F, alkyl or aryl and substituted alkyl or aryl with 1 to 20 carbon atoms; and $R_2$=alkylene or substituted alkylene with 1 to 20 carbon atoms; and at least one photoinitiator;

wherein said polymer has at least one aromatic pendant group and wherein said polymer is dissolved into its polymerizable monomer.

17. An imprintable polymer solution for imprinting, said polymer solution comprising:

at least one polymer dissolved in at least one polymerizable monomer, wherein said at least one polymer is dissolved into any monomer or monomer mixture that said at least one polymer is soluble in, and wherein said at least one polymer has a structure selected from the group consisting of:

Type A:

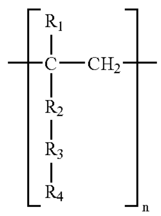

where:

$R_1$=H, $CH_3$, Cl, F, aryl group, $R_2$=bond, C(O), O, C(O)O, OC(O), $R_3$=$CH_2$, $CH_2CH_2$ or branched or linear alkyl chain with 2 to 10 carbons, $R_4$=H, $CH_3$, F, Cl, Br, branched or linear alkyl chain with 2 to 20 carbons, aryl or substituted aryl, $OR_5$, $C(O)OR_5$ and $C(O)R_5$, $R_5$=H, $CH_3$, branched or linear alkyl chain of 2 to 20 carbons with or without substitution, aryl or substituted aryl groups;

Type B: has the same structure as that of Type A, but using polymerization of more than one monomer selected from the polymers to obtain Type A polymers;

Type C:

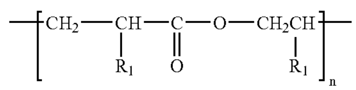

where:

$R_1$=H, $CH_3$, alkyl or aryl group with and without substitution; and

Type D:

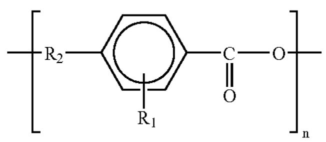

where:

$R_1$=H, Cl, Br, F, alkyl or aryl and substituted alkyl or aryl with 1 to 20 carbon atoms; and $R_2$=alkylene or substituted alkylene with 1 to 20 carbon atoms; and at least one photoinitiator;

wherein at least one said polymer has polymerizable end-groups that can be substituted for any of said structures and optionally in combination with or without cross-linkers.

18. The polymer solution of claim 17 wherein said polymer is selected from the group consisting of polystyrene with methacrylate terminated, poly(tetrahydrofuran) divinyl ether, poly(ethylene glycol) diacrylate, poly(ethylene glycol) dimethacrylate, poly(propylene glycol) diacrylate, poly(propylene glycol) dimethacrylate, and poly(dimethyl siloxane) with divinyl terminated.

19. An imprintable polymer solution for imprinting, said polymer solution comprising:

at least one polymer dissolved in at least one polymerizable monomer, wherein said polymerizable monomer is selected from the group consisting of methyl methacrylate, butyl methacrylate, hexyl methacrylate, hexyl acrylate, ethylhexyl methacrylate, ethyl hexyl acrylate, octyl acrylate, octyl methacrylate, benzyl methacrylate, benzyl acrylate, trifl uoroethyl acrylate, trifl uoroethyl methacryl ate, hyd roxyethyl acrylate, hyd roxyethyl methacrylate, styrene, oc-methylstyrene, vinyltoluene, chloromethyl styrene, butadiene, vinyl pyrrolidone, vinyl imidazole, allyl alcohol, and vinyl acetate, acrylonitrile, glycidyl methacrylate, ethyl acrylate, ethyl methacrylate, and mixtures thereod; and at least one photoinitiator selected from the group of consisting of α-hydroxy-ketones, α-amino-ketones, and benzophenones.

20. An imprintable polymer solution for imprinting, said polymer solution comprising:

at least one polymer dissolved in at least one polymerizable monomer;

at least one macro monomer with polymerizable end-groups, each containing a polymer; and at least one photoinitiator selected from the group consisting of α-hydroxy-ketones, α-amino-ketones, and benzophenones;

wherein the imprintable polymer solutions has a glass transition temperature ranging from about 0° C. to about 100° C.

21. The polymer solution of claim 1 wherein at least one said polymerizable monomer is the same as monomer units comprising said at least one polymer.

22. The polymer solution of claim 1 wherein upon imprinting, the imprinting polymer solution forms a polymer film having a relatively pure polymer that is substantially uniform in composition.

* * * * *

UNITED STATES PATENT AND TRADEMARK OFFICE

CERTIFICATE OF CORRECTION

PATENT NO. : 7,750,059 B2
APPLICATION NO. : 10/313596
DATED : July 6, 2010
INVENTOR(S) : Gun Young Jung et al.

It is certified that error appears in the above-identified patent and that said Letters Patent is hereby corrected as shown below:

In column 10, line 25, in Claim 9, delete "$OH_3$," and insert -- $CH_3$, --, therefor.

In column 10, line 28, in Claim 9, delete "Type B" and insert -- Type B: --, therefor.

In column 11, line 26, in Claim 14, delete "group" and insert -- group, --, therefor.

In column 11, line 66, in Claim 14, delete "polydisperisity" and insert -- polydispersity --, therefor.

In column 12, line 26, in Claim 16, delete "$CH_2$,$CH_2CH_2$" and insert -- $CH_2$, $CH_2CH_2$ --, therefor.

In column 14, line 24, in Claim 19, delete "ethyl hexyl" and insert -- ethylhexyl --, therefor.

In column 14, line 26, in Claim 19, delete "trifl uoroethyl" and insert -- trifluoroethyl --, therefor.

In column 14, line 26-27, in Claim 19, delete "trifl uoroethyl methacryl ate," and insert -- trifluoroethyl methacrylate, --, therefor.

In column 14, line 27, in Claim 19, before "acrylate," delete "hyd roxyethyl" and insert -- hydroxyethyl --, therefor.

In column 14, line 27, in Claim 19, after "acrylate," delete "hyd roxyethyl" and insert -- hydroxyethyl --, therefor.

In column 14, line 28, in Claim 19, delete "oc-methylstyrene," and insert -- $\alpha$-methylstyrene, -- therefor.

In column 14, line 32, in Claim 19, delete "thereod;" and insert -- thereof; --, therefor.

Signed and Sealed this

Twenty-sixth Day of October, 2010

David J. Kappos
*Director of the United States Patent and Trademark Office*

In column 14, line 33, in Claim 19, after “group” delete “of”.

In column 14, line 45, in Claim 20, delete “solutions” and insert -- solution --, therefor.